(12) United States Patent
Katsumata et al.

(10) Patent No.: US 10,741,502 B2
(45) Date of Patent: Aug. 11, 2020

(54) MULTILAYER CIRCUIT BOARD

(71) Applicant: TDK Corporation, Tokyo (JP)

(72) Inventors: Masashi Katsumata, Tokyo (JP); Yoshihiro Suzuki, Tokyo (JP); Reo Hanada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/185,596

(22) Filed: Nov. 9, 2018

(65) Prior Publication Data

US 2019/0164904 A1 May 30, 2019

(30) Foreign Application Priority Data

Nov. 29, 2017 (JP) ................................ 2017-229349

(51) Int. Cl.
| | |
|---|---|
| *H01L 23/552* | (2006.01) |
| *H01L 25/16* | (2006.01) |
| *H01L 23/31* | (2006.01) |
| *H01L 23/538* | (2006.01) |
| *H01L 23/498* | (2006.01) |
| *H01L 21/48* | (2006.01) |
| *H05K 1/02* | (2006.01) |

(52) U.S. Cl.
CPC .......... *H01L 23/552* (2013.01); *H01L 21/486* (2013.01); *H01L 21/4857* (2013.01); *H01L 23/3121* (2013.01); *H01L 23/49894* (2013.01); *H01L 23/5383* (2013.01); *H01L 23/5386* (2013.01); *H01L 23/5389* (2013.01); *H01L 25/16* (2013.01); *H05K 1/02* (2013.01); *H01L 2224/18* (2013.01)

(58) Field of Classification Search
CPC ............... H01L 23/552; H01L 23/3121; H01L 23/49894; H01L 23/5383; H01L 23/5386; H01L 23/5389; H01L 25/16; H01L 21/486; H01L 21/4857
See application file for complete search history.

(56) References Cited

U.S. PATENT DOCUMENTS

| | | | |
|---|---|---|---|
| 2014/0061877 A1* | 3/2014 | Lin ........................ | H01L 24/82 257/659 |
| 2015/0194388 A1* | 7/2015 | Pabst .................... | H01L 23/552 257/659 |

FOREIGN PATENT DOCUMENTS

JP      2012195468 A     10/2012

* cited by examiner

*Primary Examiner* — Peniel M Gumedzoe
(74) *Attorney, Agent, or Firm* — Young Law Firm, P.C.

(57) ABSTRACT

Disclosed herein is a multilayer circuit board that includes a plurality of conductor layers laminated with insulating layers interposed therebetween. The plurality of conductor layers include a first conductor layer, a second conductor layer, and a first shield layer disposed between the first and second conductor layers. The first shield layer is smaller in conductor thickness than the first and second conductor layers and is connected to none of the plurality of conductor layers within its surface.

20 Claims, 18 Drawing Sheets

MULTILAYER CIRCUIT BOARD

BACKGROUND OF THE INVENTION

Field of the Invention

The present invention relates to a multilayer circuit board and, more particularly, to a multilayer circuit board having a shield function between conductor layers.

Description of Related Art

In recent years, a multilayer circuit board provided with a plurality of conductor layers is becoming more and more refined, and there also exists a multilayer circuit board having a shield function like the one described in JP 2012-195468 A. The multilayer circuit board described in JP 2012-195468 A includes an electronic component embedded in an insulating layer and a plurality of shield layers covering the electronic component.

However, simply adding the shield layers to the multilayer circuit board correspondingly increases the entire thickness of the multilayer circuit board. Recently, in particular, a multilayer circuit board used for a mobile type device such as a smartphone is required to be as thin as possible, so that it is difficult for the method of simply adding the shield layer to satisfy the requirement for thinning.

Further, in recent years, not only the shield function against the outside environment, but also a shield function between the plurality of conductor layers constituting the multilayer circuit board is sometimes required. To achieve this, a shield layer needs to be provided between two conductor layers; however, when the shield layer is reduced in thickness so as to satisfy the requirement for thinning, connection of a via conductor to the shield layer will become difficult. That is, when the conductor thickness of the shield layer is small, laser beam irradiated for formation of a via onto an insulating layer covering the shield layer may break the shield layer.

SUMMARY

It is therefore an object of the present invention to provide a multilayer circuit board having a shield function between the conductor layers and capable of preventing breakage of the shield layer during the manufacturing process.

A multilayer circuit board according to the present invention includes a plurality of conductor layers laminated with insulating layers interposed therebetween. The plurality of conductor layers include a first conductor layer, a second conductor layer, and a first shield layer disposed between the first and second conductor layers. The first shield layer is smaller in conductor thickness than the first and second conductor layers and is connected to none of the plurality of conductor layers within its surface.

According to the present invention, the first shield layer is smaller in thickness than the first and second conductor layers, so that it is possible to minimize an increase in the entire thickness of the multilayer circuit board due to the provision of the first shield layer. In the present invention, the conductor thickness of the first shield layer can be ⅕ or less of the conductor thickness of each of the first and second conductor layers. In addition, there is no need to connect a via conductor to the first shield layer, so that it is possible to prevent the shield layer from being broken by laser beam irradiation.

The multilayer circuit board according to the present invention may further include a side surface conductor formed on the side surface thereof, and the first shield layer may be connected to any of the plurality of conductor layers through the side surface conductor. With this configuration, it is possible to give a fixed potential such as a ground potential to the first shield layer by a simple method.

The multilayer circuit board according to the present invention may further include an electronic component mounted on the main surface thereof, a mold member that covers the main surface so as to embed the electronic component therein, and a shield conductor that covers the surface of the mold member, and the shield conductor may be connected to the first shield layer through the side surface conductor. This allows the same potential to be given to the first shield layer and shield conductor.

In the present invention, the first shield layer may have a clearance region where no conductor pattern exists, and the first and second conductor layers may be connected to each other through a via conductor penetrating the clearance region. This allows the first and second conductor layers to be connected to each other without forming a via conductor in the first shield layer.

In the present invention, the diameter of a part of the via conductor that is connected to the first conductor layer may be larger than a part thereof that is connected to the second conductor layer, the insulating layer may include a first insulating layer provided between the first conductor layer and the first shield layer and a second insulating layer provided between the second conductor layer and the first shield layer, and the first insulating layer may be thicker than the second insulating layer. This facilitates the via formation using laser irradiation while maintaining high mechanical strength of the first insulating layer. For example, the amount of glass cloth contained in the first insulating layer can be made larger than that contained in the second insulating layer. Further, when the dielectric constant of the second insulating layer is made lower than that of the first insulating layer, a parasitic capacitance generated between the first shield layer and the second conductor layer can be reduced.

The multilayer circuit board according to the present invention may further include a semiconductor chip embedded in the insulating layer. This allows a more sophisticated multilayer circuit board to be provided.

In the present invention, the plurality of conductor layers may further include a third conductor layer, a fourth conductor layer, and a second shield layer disposed between the third and fourth conductor layers, the semiconductor chip may be disposed between the first and second shield layers, and the second shield layer may be smaller in conductor thickness then the first to fourth conductor layers and connected to none of the plurality of conductor layers within its surface. This allows the semiconductor chip to be shielded at both the upper and lower sides.

Thus, according to the present invention, there can be provided a multilayer circuit board having a shield function between the conductor layers and capable of preventing breakage of the shield layer during the manufacturing process.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will be explained below in detail with reference to the accompanying drawings.

First Embodiment

Figure 1:
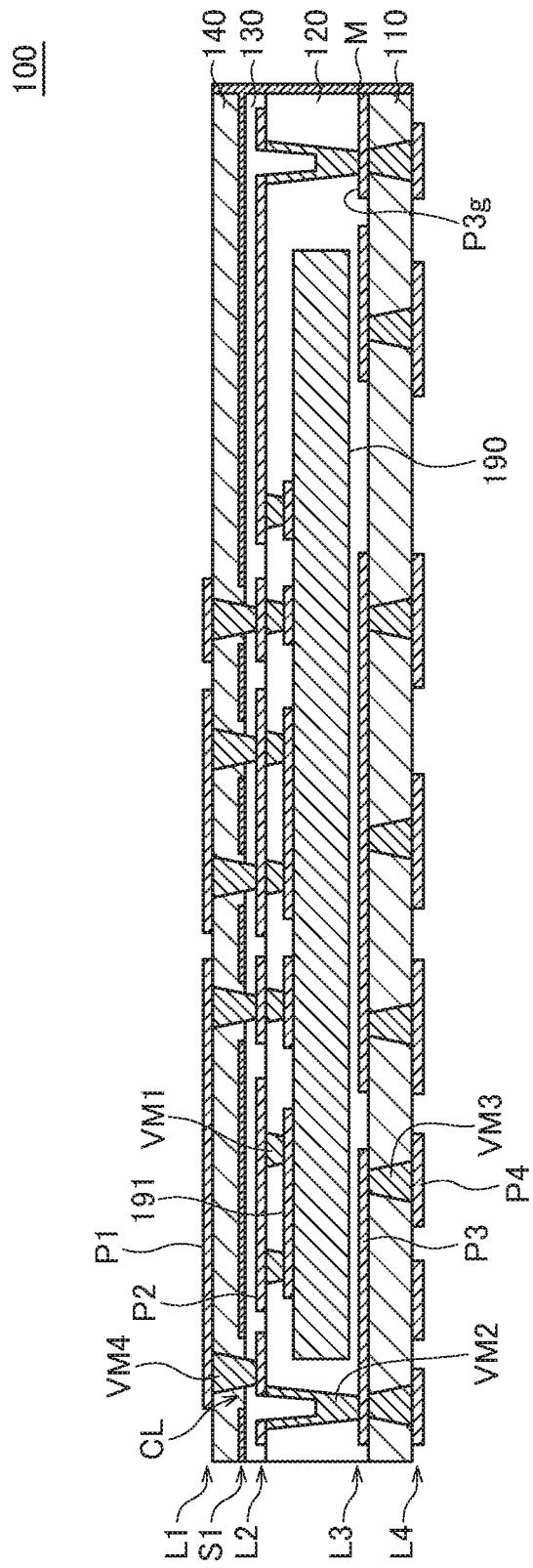
FIG. 1 is a schematic cross-sectional view for explaining the configuration of a multilayer circuit board according to a first embodiment of the present invention.

FIG. 1 is a schematic cross-sectional view for explaining the configuration of a multilayer circuit board 100 according to the first embodiment of the present invention.

As illustrated in FIG. 1, the multilayer circuit board 100 according to the present embodiment has a structure in which five conductor layers are laminated. The five conductor layers mutually adjacent in the lamination direction are separated by insulating layers 110, 120, 130, and 140. The five conductor layers include conductor layers L1 to L4 and a shield layer S1. The conductor layers L1 to L4 are each a conductor layer in which a signal line or a power supply line is formed, and the shield layer S1 is a conductor layer functioning as an electromagnetic shield. Although not particularly limited in the present invention, a semiconductor chip 190 is embedded in the insulating layer 120 in the present embodiment. A terminal electrode 191 provided on the surface of the semiconductor chip 190 is connected to a conductor pattern P2 provided in the conductor layer L2 through a via conductor VM1.

The conductor pattern P2 provided in the conductor layer L2 and a conductor pattern P3 provided in the conductor layer L3 are connected to each other through a via conductor VM2 penetrating the insulating layer 120. Similarly, the conductor pattern P3 provided in the conductor layer L3 and a conductor pattern P4 provided in the conductor layer L4 are connected to each other through a via conductor VM3 penetrating the insulating layer 110. A conductor pattern P1 provided in the conductor layer L1 and the conductor pattern P2 provided in the conductor layer L2 are connected to each other through a via conductor VM4 penetrating the insulating layers 130 and 140.

Although the conductor thickness of each of the above conductor layers L1 to L4 is not particularly limited, it is set as small as possible in a range where required signal characteristics or required power supply characteristics are satisfied and where the conductor layers L1 to L4 are not easily broken by laser beam irradiation. For example, the thickness of each of the conductor layers L1 to L4 can be set to about 10 μm to about 20 μm.

On the other hand, the shield layer S1 is smaller in conductor thickness than the conductor layers L1 to L4 and is connected to none of the conductor layers L1 to L4 within its surface. That is, as illustrated in FIG. 1, although the shield layer S1 is disposed between the conductor layers L1 and L2, there is no via conductor that connects the shield layer S1 to the conductor layer L1 or L2. The shield layer S1 is connected to any of the conductor layers L1 to L4 through a side surface conductor M formed on the side surface of the circuit board. In the example of FIG. 1, the shield layer S1 is connected to a conductor pattern P3g (ground pattern to which a ground potential is given) included in the conductor patterns P3 formed in the conductor layer L3. In the example of FIG. 1, the side surface conductor M is connected to the ground pattern at one point; however, it may be connected to the ground pattern at a plurality of points. Further, the side surface conductor M may not necessary be formed on one side surface, and may be formed on a plurality of side surfaces.

The shield layer S1 shields the conductor layers L1 and L2 from each other to thereby prevent a signal propagating in the conductor layer L1 and a signal propagating in the conductor layer L2 from affecting each other. The shield layer S1 is thus a conductor layer specialized in the shield function, so that the conductor thickness thereof can be made as small as possible in a range satisfying a required shield function. The shield layer S1 can fulfill a sufficient shield function even though it has a thickness much smaller than those of the conductor layers L1 to L4 which are required to have signal or power supply characteristics. As the actual conductor thickness, about 0.5 μm to about 4 μm, preferably, about 1 μm to about 2 μm is enough. The ratio of the conductor thickness of the shield layer S1 to that of each of the conductor layers L1 to L4 can be ⅕ or less, preferably, about 1/10. As described above, the shield layer S1 is much smaller in conductor thickness than the conductor layers L1 to L4, making it possible to minimize an increase in the entire thickness of the multilayer circuit board 100.

When the shield layer S1 has such a small thickness, the shield layer S1 may be broken by heat when it is irradiated with laser beam, thus making it difficult to directly connect the via conductor to the shield layer S1. However, in the present embodiment, a fixed potential such as a ground potential is given without connection of the via conductor to the shield layer S1, but through the side surface conductor M. This eliminates the need to irradiate a laser beam onto the shield layer S1 during the manufacturing process, thereby preventing the shield layer S1 from being broken during the manufacturing process.

As described above, the conductor layers L1 and L2 positioned on both sides of the shield layer S1 are connected to each other through the via conductor VM4. A clearance region CL is provided in the shield layer S1 so as to overlap the via conductor VM4 in a plan view, and the via conductor VM4 penetrates the clearance region CL. With this configuration, interference between the via conductor VM4 and the shield layer S1 is prevented.

Thus, in the multilayer circuit board 100 according to the present embodiment, the shield layer S1 is provided between the conductor layers L1 and L2, allowing the conductor layers L1 and L2 to be shielded from each other. In addition, the shield layer S1 is much smaller in thickness than the conductor layers L1 to L4, making it possible to minimize an increase in the entire thickness of the multilayer circuit board 100. Further, the shield layer S1 is connected to none of the conductor layers L1 to L4 within its surface, so that even when the conductor thickness of the shield layer S1 is made sufficiently small, the shield layer S1 is not broken during the manufacturing process.

Although not particularly limited, by differentiating the film thickness or material of the insulating layers 130 and 140, it is possible to improve various characteristics of the multilayer circuit board 100 or facilitate the manufacturing thereof. For example, by using a resin material containing glass cloth for the insulating layer 140 and using a resin material not containing glass cloth (or containing a small amount of glass cloth) for the insulating layer 130 it is possible to facilitate a process of forming a via for the via conductor VM4. Particularly, when the film thickness of the insulating layer 140 is made larger than that of the insulating layer 130, the mechanical strength of the multilayer circuit board 100 can be kept high by the insulating layer 140 containing the glass cloth. When the film thickness of the insulating layer 130 is made small, a parasitic capacitance generated between the shield layer S1 and the conductor layer L2 is increased, but the increase in the parasitic capacitance can be suppressed by making the dielectric constant of the insulating layer 130 lower than that of the insulating layer 140.

Next, a manufacturing method for the multilayer circuit board 100 will be described.

Figure 2:
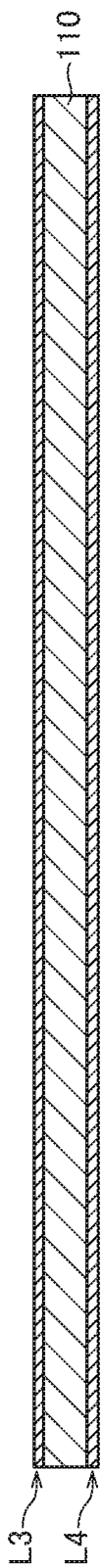
FIGS. 2 to 16 are process views for explaining a fabricating method of the multilayer circuit board according to the first embodiment of the present invention.
Figure 3:
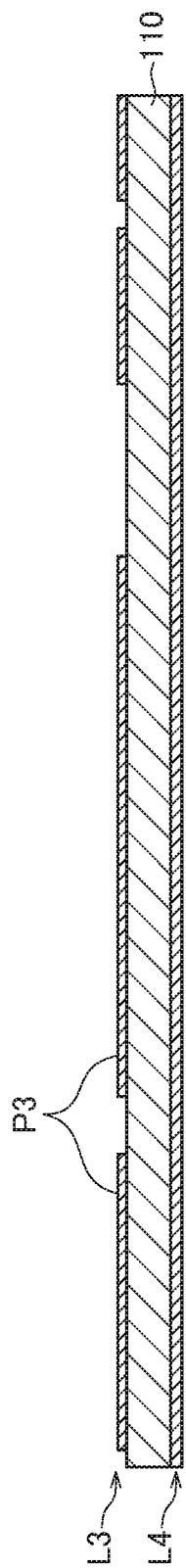

First, as illustrated in FIG. 2, the insulating layer 110 having the conductor layers L3 and L4 formed on both surfaces thereof is prepared. As the material for the insulating layer 110, a resin material containing glass cloth is preferably used, and the thickness thereof can be adjusted to, e.g., about 30 µm to about 50 µm. The thickness of each of the conductor layers L3 and L4 is about 10 µm to 20 µm. After that, as illustrated in FIG. 3, the conductor layer L3 is patterned to form the conductor pattern P3.

Figure 4:
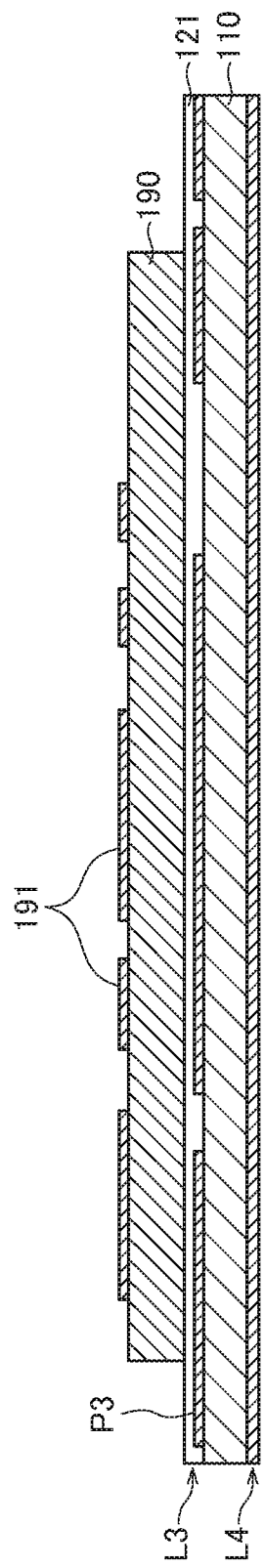

Subsequently, as illustrated in FIG. 4, an insulating layer 121 covering the conductor layer L3 is formed, and the semiconductor chip 190 is mounted on the insulating layer 121 by a face-up method. The face-up method is a method in which the semiconductor chip 190 is mounted with the terminal electrode 191 facing upward. After that, heat is applied to harden the insulating layer 121.

Figure 5:
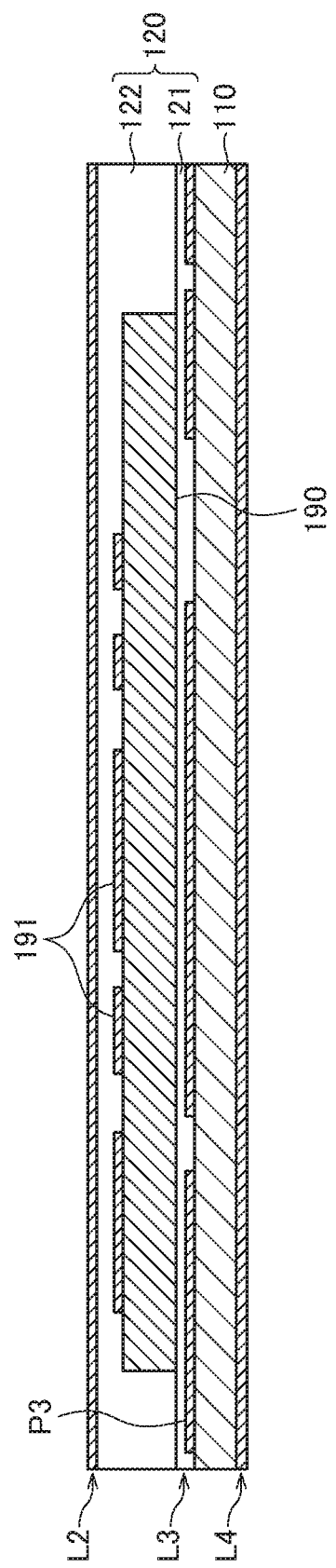

Subsequently, as illustrated in FIG. 5, an insulating layer 122 (unhardened) on one surface of which the conductor layer L2 is formed is prepared, and the semiconductor chip 190 is embedded in the insulating layer 122. After that, heat is applied to harden the insulating layer 122. The insulating layers 121 and 122 constitute the insulating layer 120 illustrated in FIG. 1, and a resin material not containing glass cloth is preferably used as the material therefor.

Figure 6:
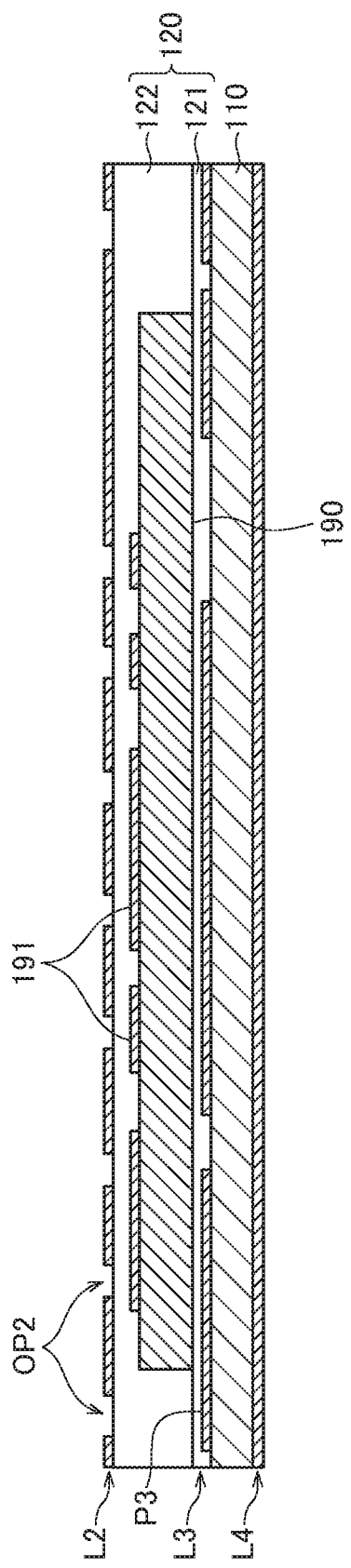
Figure 7:
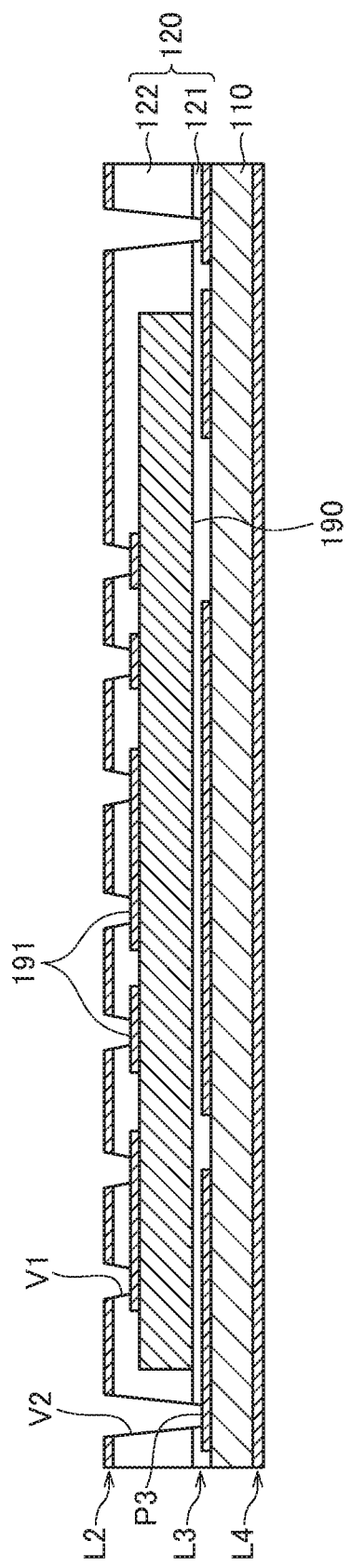

Subsequently, as illustrated in FIG. 6, the conductor layer L2 is patterned to form an opening part OP2 in the conductor layer L2. After that, as illustrated in FIG. 7, a laser beam is irradiated to the opening part OP2 to form vias V1 and V2. The via V1 is a via for exposing the terminal electrode 191 of the semiconductor chip 190. The via V2 is a via penetrating the insulating layers 122 and 121 so as to expose the conductor layer L3. In forming the vias V1 and V2 using a laser beam, the terminal electrode 191 or conductor layer L3 exposed at the bottom of the vias V1 or V2 functions as a stopper. The terminal electrode 191 or conductive layer L3 has a sufficient thickness to function as a stopper and is thus not broken by the laser beam irradiation. Further, the vias V1 and V2 are each shaped such that the diameter thereof at the upper part (incident side of the laser beam), is large, and the diameter thereof at the bottom (the side opposite to the incident side of the laser beam) is small.

Figure 8:
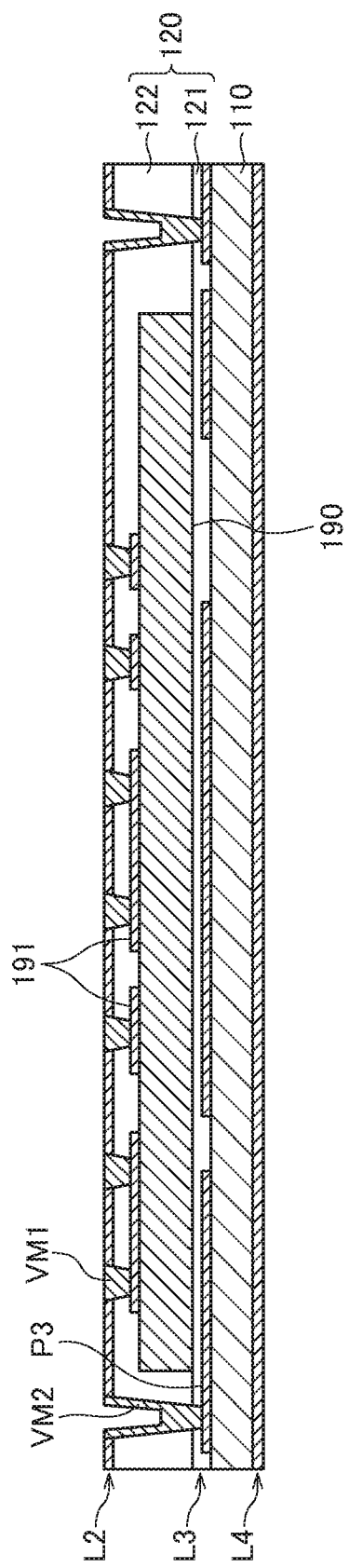
Figure 9:
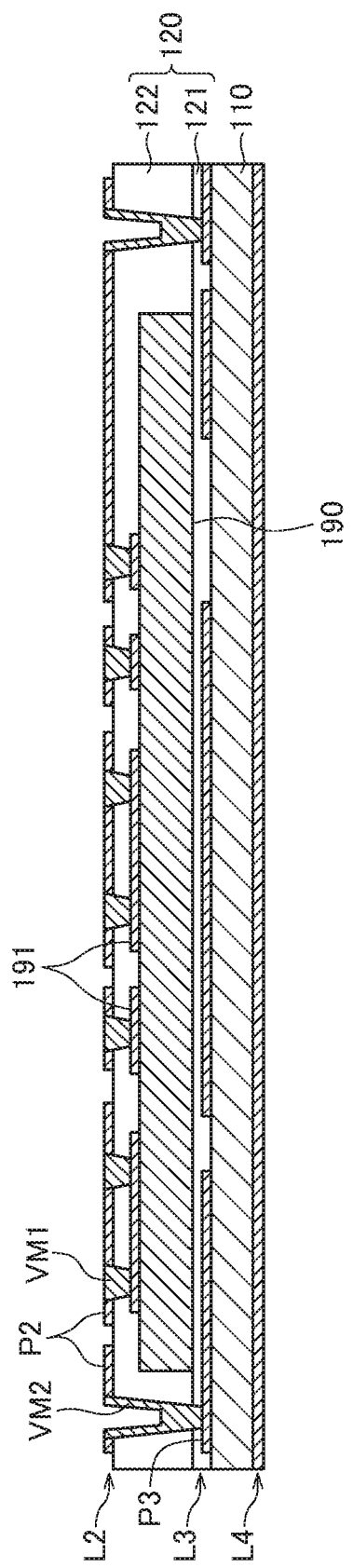

Subsequently, as illustrated in FIG. 8, the via conductors VM1 and VM2 are formed inside the vias V1 and V2, respectively. Preferably, in forming the via conductors VM1 and VM2, a thin underlying conductor layer is formed by electroless plating, followed by electrolytic plating until a desired film thickness is achieved. In the present example, the via V2 is deeper than the via V1, so that the via V2 is not completely filled with the via conductor VM2. After that, as illustrated in FIG. 9, the conductor layer L2 is patterned to form the conductor pattern P2.

Figure 10:
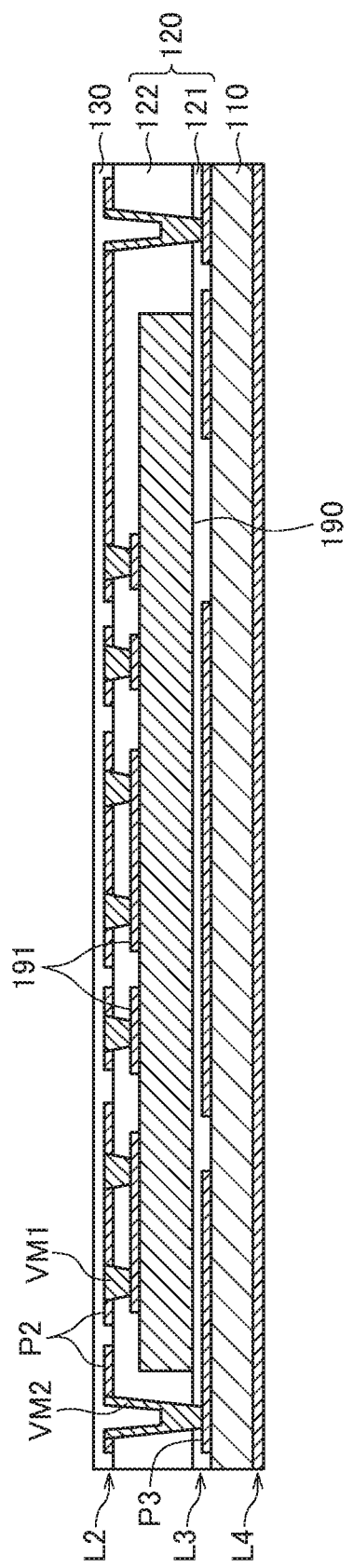
Figure 11:
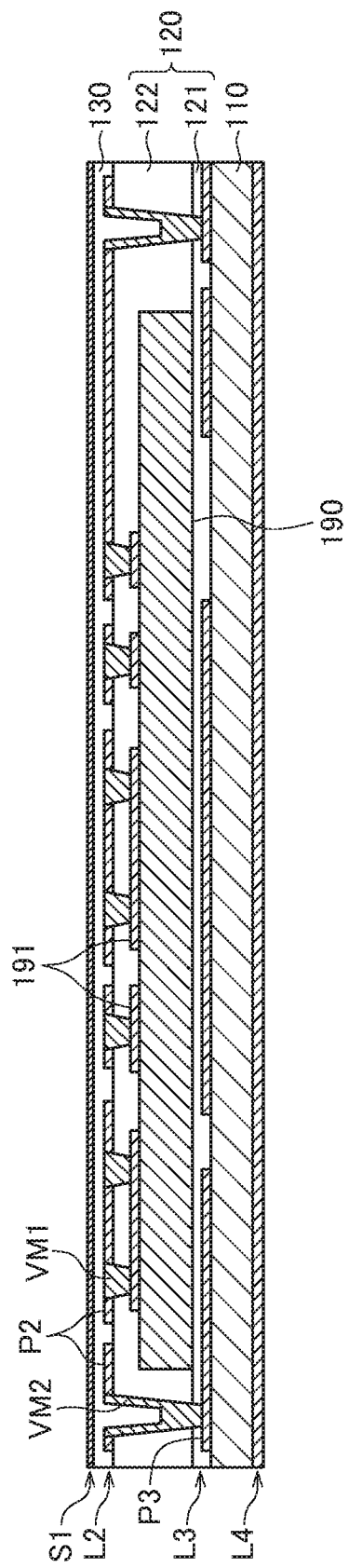
Figure 12:
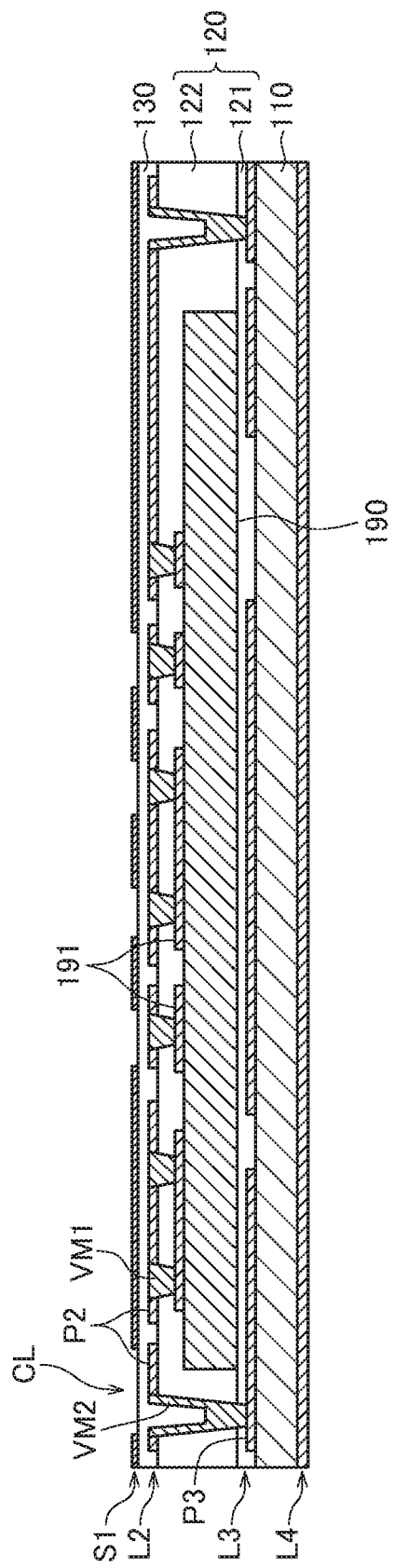

Subsequently, as illustrated in FIG. 10, the insulating layer 130 covering the conductor layer L2 is formed. As described above, as the material for the insulating layer 130, a resin material not containing glass cloth and low in dielectric constant is preferably used. After that, as illustrated in FIG. 11, the shield layer S1 is formed on the surface of the insulating layer 130. Although not particularly limited, the process of forming the shield layer S1 is preferably performed such that a carrier on one surface of which the shield layer S1 is formed is used to hot-press the insulating layer 130 to harden the same, followed by removal of the carrier. After that, as illustrated in FIG. 12, the shield layer S1 is patterned to form the clearance region CL.

Figure 13:
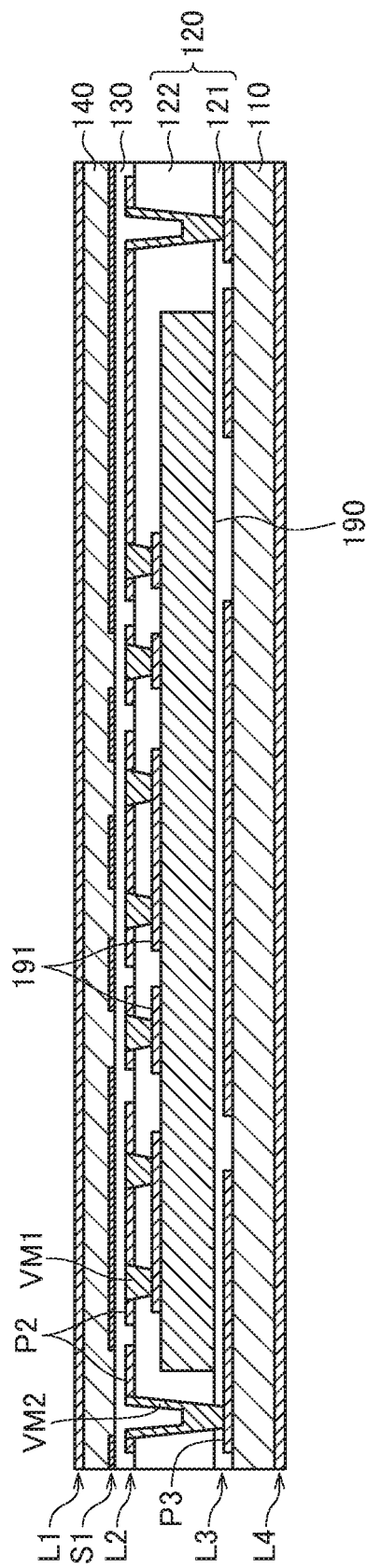

Subsequently, as illustrated in FIG. 13, the insulating layer 140 (unhardened) on one surface of which the conductor layer L1 is formed is prepared, and the shield layer S1 is covered with the insulating layer 140. After that, heat is applied to harden the insulating layer 140. As the material for the insulating layer 140, a resin material containing glass cloth is preferably used.

Figure 14:
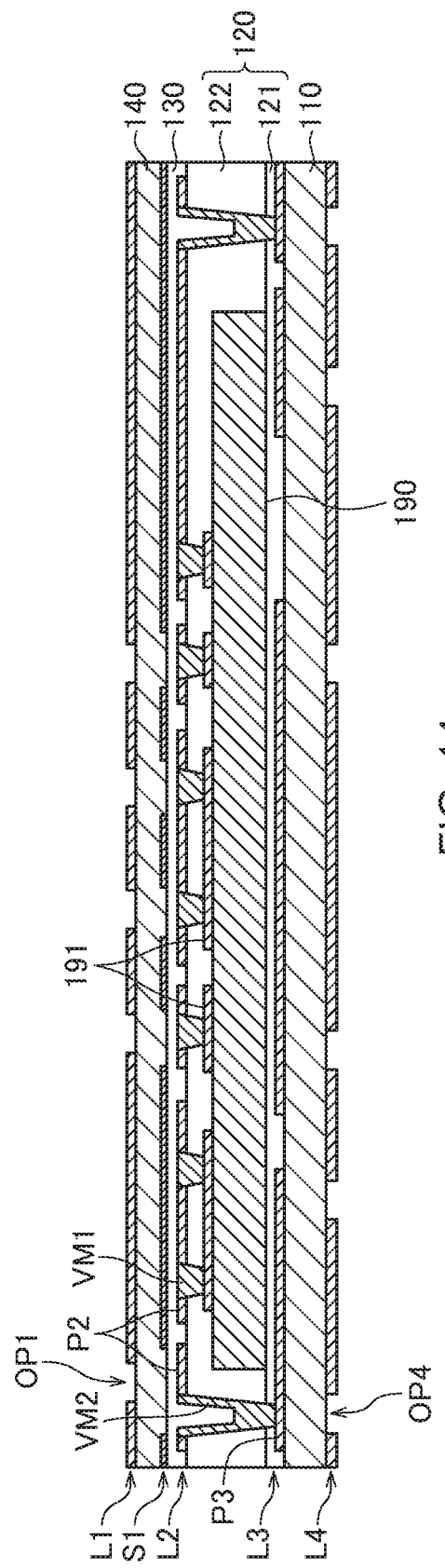
Figure 15:
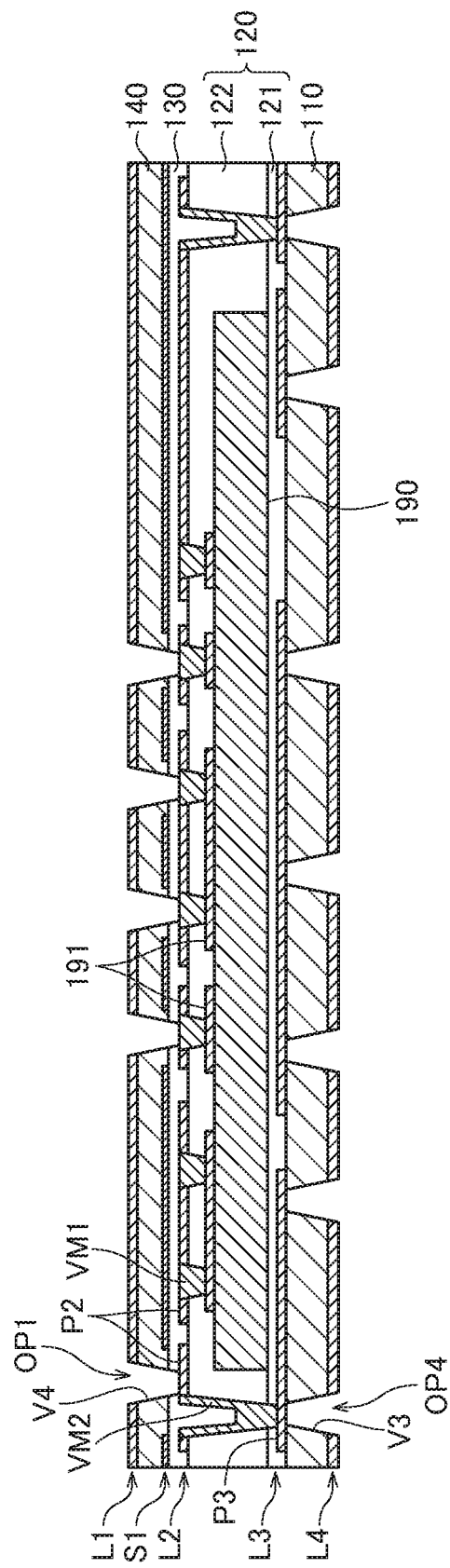

Subsequently, as illustrated in FIG. 14, the conductor layers L1 and L4 are patterned to form opening parts OP1 and OP4 in the conductor layers L1 and L4, respectively. The opening part OP1 needs to be formed so as to entirely overlap the clearance region CL in a plan view. That is, the opening part OP1 is formed at a position not overlapping the shield layer S1 in a plan view. After that, as illustrated in FIG. 15, a laser beam is irradiated to the opening parts OP1 and OP4 to form vias V3 and V4. The via V3 is a via penetrating the insulating layer 110 so as to expose the conductor layer L3. The via V4 is a via penetrating the insulating layers 130 and 140 through the clearance region CL so as to expose the conductor layer L2. In forming the vias V3 and V4 using a laser beam, the conductor layer L2 or L3 exposed at the bottom of the vias V3 or V4 functions as a stopper. The conductor layer L2 or L3 has a sufficient thickness to function as a stopper and is thus not broken by the laser beam irradiation. Further, the vias V3 and V4 are each shaped such that the diameter thereof at the incident side of the laser beam is large, and the diameter thereof at the bottom (the side opposite to the incident side of the laser beam) is small.

Generally, when glass cloth is included in the insulating layer, a larger laser power is required for the formation of a via in the insulating layer by laser beam irradiation, so that it becomes difficult to form the via without damaging the conductor layer serving as the stopper. However, in the present embodiment, the glass cloth is included in the insulating layer 140 constituting the upper part of the via V4, while it is not included in the insulating layer 130 constituting the lower part of the via V4 (or content of glass cloth is small), allowing the via V4 to be easily formed without damaging the conductor layer L2.

Figure 16:
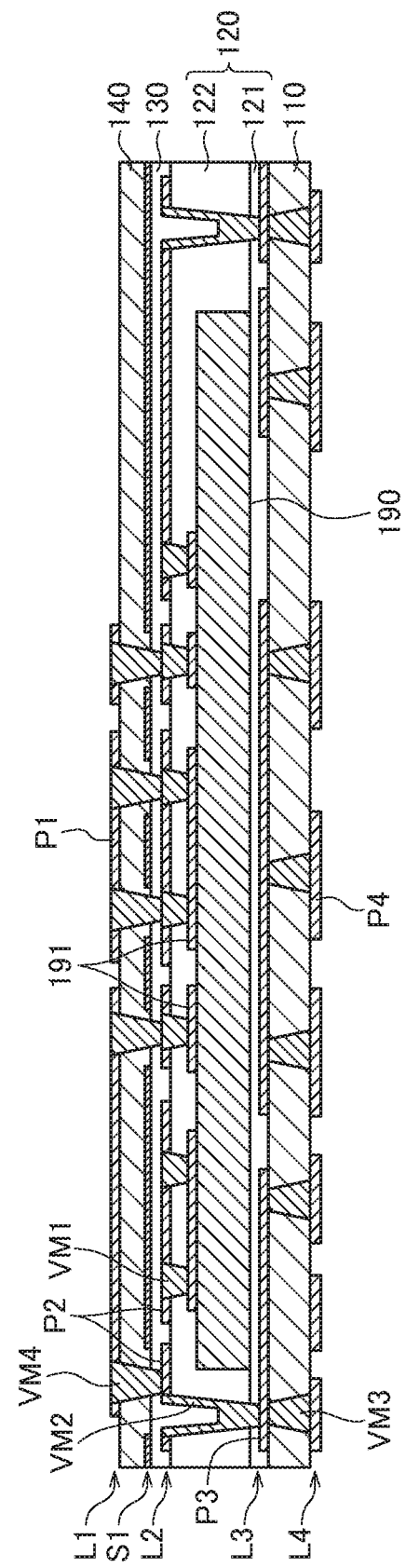

Subsequently, as illustrated in FIG. 16, the via conductors VM3 and VM4 are formed inside the vias V3 and V4, respectively. Preferably, in forming the via conductors VM3 and VM4, a thin underlying conductor layer is formed by electroless plating, followed by electrolytic plating until a desired film thickness is achieved. Then, the conductor layers L1 and L4 are patterned to form the conductor patterns P1 and P4, followed by formation of the side surface conductor M, whereby the multilayer circuit board 100 illustrated in FIG. 1 is completed. For example, as the formation method for the side surface conductor M, sputtering, application of conductive paste, vapor deposition, or the like can be used. Alternatively, the following method may be used: an aggregate board is diced along a plurality of through hole conductors previously formed so as to penetrate the aggregate board to expose the through hole conductors on the dicing surface as the side surface conductors M.

As described above, in the present embodiment, the clearance region CL is previously provided at a position where the via V4 needs to be formed, so that it is possible to connect the conductor layers L1 and L2 while avoiding contact between the shield layer S1 and the via conductor VM4. Further, no via conductor is connected to the shield layer S1 within its surface, no laser beam is irradiated onto the shield layer S1. This allows the thickness of the shield layer S1 to be very small.

Further, in the present embodiment, glass cloth is included in the insulating layers 110 and 140 positioned at the outermost layer, so that it is possible to ensure sufficient mechanical strength even when the entire thickness thereof is reduced.

Second Embodiment

Figure 17:
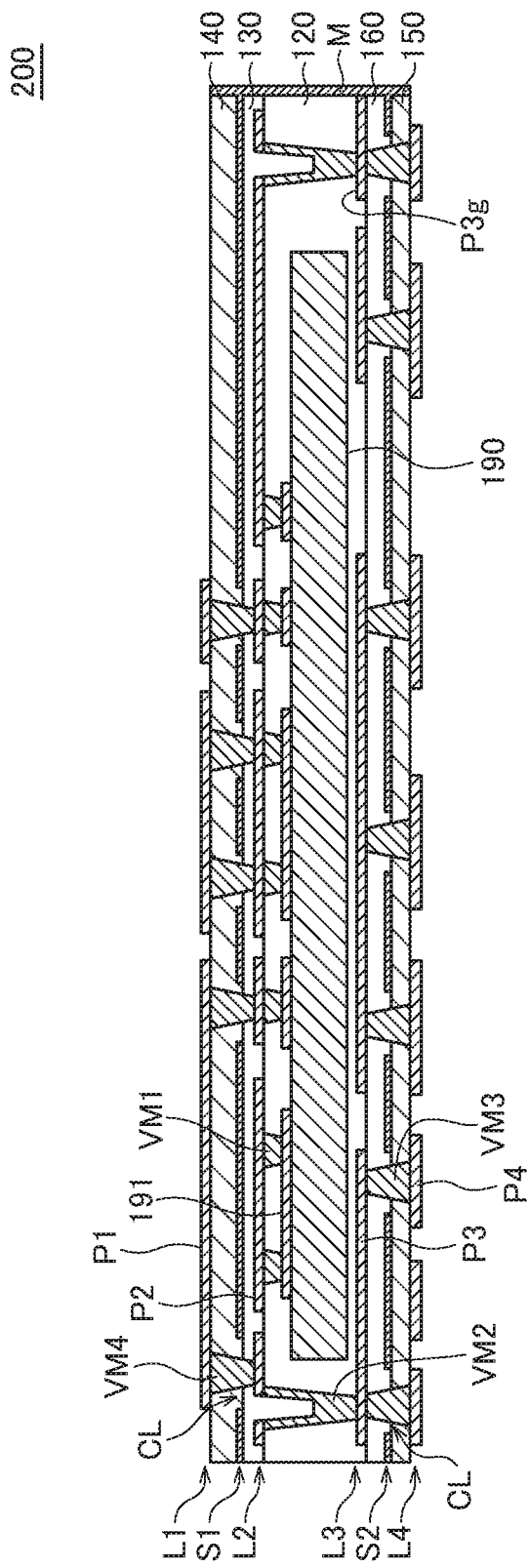
FIG. 17 is a schematic cross-sectional view for explaining the configuration of a multilayer circuit board according to a second embodiment of the present invention.

FIG. 17 is a schematic cross-sectional view for explaining the configuration of a multilayer circuit board 200 according to the second embodiment of the present invention.

As illustrated in FIG. 17, the multilayer circuit board 200 according to the present embodiment differs from the multilayer circuit board 100 according to the first embodiment in that it further includes a shield layer S2 disposed between the conductor layers L3 and L4. Accordingly, the insulating layer 110 illustrated in FIG. 1 is replaced by two insulating layers 150 and 160. Other basic configurations are the same as those of the multilayer circuit board 100 according to the first embodiment, so the same reference numerals are given to the same elements, and overlapping description will be omitted.

Like the shield layer S1, the shield layer S2 is smaller in conductor thickness than the conductor layers L1 to L4 and is connected to none of the conductor layers L1 to L4 within its surface. The shield layers S1 and S2 may have the same thickness. Further, like the shield layer S1, the shield layer S2 is connected to any of the conductor layers L1 to L4 through the side surface conductor M. In the example of FIG. 17, the shield layer S2 is connected to a conductor pattern P3g (ground pattern to which a ground potential is given) included in the conductor patterns P3 formed in the conductor layer L3.

The shield layer S2 also has the clearance region CL, and the via conductor VM3 connecting the conductor layers L3 and L4 penetrates the clearance region CL provided in the shield layer S2.

It is preferable that the insulating layers 150 and 160 are made of the same materials as the insulating layers 140 and 130, respectively, and have the same thicknesses as the insulating layers 140 and 130, respectively. For example, it is preferable that the insulating layers 140 and 150 are each made of a resin material containing glass cloth and have the same thickness, and it is preferable that the insulating layers 130 and 160 are each made of a resin material not containing glass cloth and have the same thickness.

The multilayer circuit board 200 according to the present embodiment includes the shield layer S2, so that it is possible to prevent a signal propagating in the conductor layer L3 and a signal propagating in the conductor layer L4 from affecting each other. In addition, both the upper and lower sides of the semiconductor chip 190 are covered with the shield layers S1 and S2, respectively, so that it is possible to enhance the shielding effect with respect to the semiconductor chip 190. Further, the symmetry in the vertical direction within the board is increased, making it possible to reduce warp of the multilayer circuit board 200 attributable to asymmetry.

Third Embodiment

Figure 18:
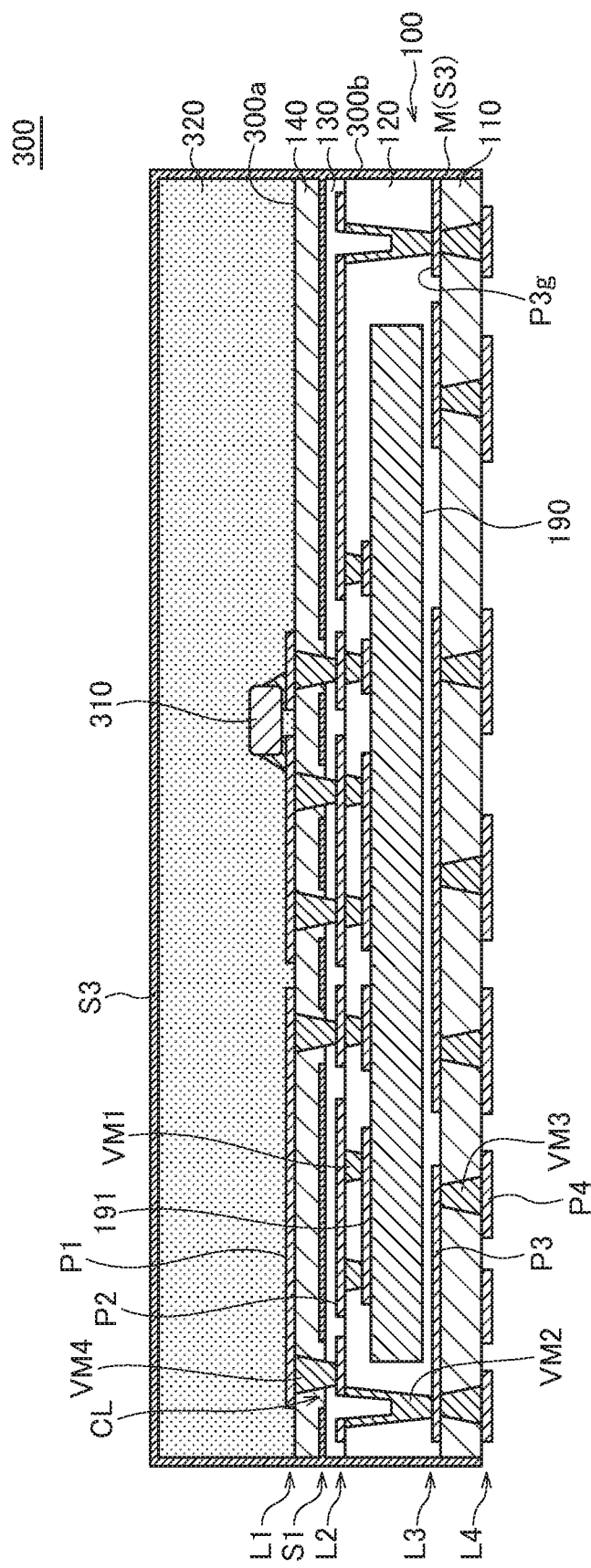
FIG. 18 is a schematic cross-sectional view for explaining the configuration of a multilayer circuit board according to the third embodiment of the present invention.

FIG. 18 is a schematic cross-sectional view for explaining the configuration of a multilayer circuit board 300 according to the third embodiment of the present invention.

As illustrated in FIG. 18, the multilayer circuit board 300 according to the present embodiment further includes an electronic component 310 mounted on a main surface 300a, a mold member 320 that covers the main surface 300a of the board so as to embed the electronic component 310 therein, and a shield conductor S3 that covers the surface of the mold member 320. Other basic configurations are the same as those of the multilayer circuit board 100 according to the first embodiment, so the same reference numerals are given to the same elements, and overlapping description will be omitted.

The mold member 320 is provided to protect the electronic component 310. Although only one electronic component 310 is illustrated in FIG. 18, many electronic components can actually be mounted on the main surface 300a. Examples of the electronic component 310 include a passive element such as a capacitor, an inductor or a resistor, an active element such as a transistor or a diode, and an integrated circuit such as a semiconductor chip.

The shield conductor S3 covers the upper and side surfaces of the mold member 320 and is connected to the conductor pattern P3g (ground pattern) exposed to a side surface 300b of the circuit board. A part of the shield conductor S3 that covers the side surface 300b of the board corresponds to the above-described side surface conductor M. With this configuration, a ground potential is given to the shield conductor S3, whereby the shield conductor S3 functions as an electromagnetic shield of the outermost layer.

As described above, the multilayer circuit board 300 according to the present embodiment includes the shield conductor S3, so that it is possible to attenuate electromagnetic wave noise coming from the outside environment or electromagnetic noise emitted from the multilayer circuit board 300. In addition, a part of the shield conductor S3 is connected to the shield layer S1 on the side surface 300b, so that there is no need to separately form the side surface conductor M.

It is apparent that the present invention is not limited to the above embodiments, but may be modified and changed without departing from the scope and spirit of the invention.

What is claimed is:
1. A multilayer circuit board comprising:
   a plurality of conductor layers laminated with insulating layers interposed therebetween; and
   a side surface conductor formed on a side surface of the multilayer circuit board,
   wherein the plurality of conductor layers include a first conductor layer, a second conductor layer, and a first shield layer disposed between the first and second conductor layers,
   wherein the insulating layers include a first insulating layer provided between the first conductor layer and the first shield layer and a second insulating layer provided between the second conductor layer and the first shield layer, wherein the first shield layer is smaller in conductor thickness than the first and second conductor layers, and wherein the first shield layer is electrically connected to at least one of the plurality of conductor layers through the side surface conductor.

2. The multilayer circuit board as claimed in claim 1, further comprising:
an electronic component mounted on a main surface of the multilayer circuit board;
a mold member that covers the main surface so as to embed the electronic component therein; and
a shield conductor that covers a surface of the mold member,
wherein the shield conductor is connected to the first shield layer through the side surface conductor.

3. The multilayer circuit board as claimed in claim 1,
wherein the first shield layer has a clearance region where no conductor pattern exists, and
wherein the first and second conductor layers are connected to each other through a via conductor penetrating the clearance region.

4. The multilayer circuit board as claimed in claim 3,
wherein a diameter of a part of the via conductor that is connected to the first conductor layer is larger than a part thereof that is connected to the second conductor layer, and
wherein the first insulating layer is thicker than the second insulating layer.

5. The multilayer circuit board as claimed in claim 4, wherein an amount of glass cloth contained in the first insulating layer is larger than that contained in the second insulating layer.

6. The multilayer circuit board as claimed in claim 4, wherein a dielectric constant of the second insulating layer is lower than that of the first insulating layer.

7. The multilayer circuit board as claimed in claim 1, further comprising a semiconductor chip embedded in one of the insulating layers.

8. The multilayer circuit board as claimed in claim 7,
wherein the plurality of conductor layers further include a third conductor layer, a fourth conductor layer, and a second shield layer disposed between the third and fourth conductor layers,
wherein the semiconductor chip is disposed between the first and second shield layers, and
wherein the second shield layer is smaller in conductor thickness then the first to fourth conductor layers.

9. The multilayer circuit board as claimed in claim 8, wherein the first shield layer is electrically connected to the second shield layer through the side surface conductor.

10. The multilayer circuit board as claimed in claim 1, wherein the conductor thickness of the first shield layer is 1/5 or less of the conductor thickness of each of the first and second conductor layers.

11. The multilayer circuit board as claimed in claim 1,
wherein the first shield layer is entirely covered with the first insulating layer so as not to be connected to the first conductor layer through a via conductor penetrating the first insulating layer, and
wherein the first shield layer is entirely covered with the second insulating layer so as not to be connected to the second conductor layer through a via conductor penetrating the second insulating layer.

12. A multilayer circuit board comprising:
a first conductor layer including a first conductor pattern;
a second conductor layer including a second conductor pattern;
a shield layer disposed between the first and second conductor layers, the shield layer including a third conductor pattern having a clearance region where the third conductor pattern is removed;
a first insulating layer provided between the first conductor layer and the shield layer;
a second insulating layer provided between the second conductor layer and the shield layer; and
a via conductor provided so as to penetrate the first and second insulating layers to connect the first conductor pattern to the second conductor pattern such that the via conductor passes pass through the clearance region,
wherein the first insulating layer is thicker than the second insulating layer, and
wherein the first insulating layer is greater in a dielectric constant than the second insulating layer.

13. The multilayer circuit board as claimed in claim 12, wherein the third conductor pattern is isolated from the first and second conductor patterns.

14. The multilayer circuit board as claimed in claim 12, wherein the first shield layer is smaller in conductor thickness than the first and second conductor layers.

15. A multilayer circuit board comprising:
a first conductor layer including a first conductor pattern;
a second conductor layer including a second conductor pattern;
a shield layer disposed between the first and second conductor layers, the shield layer including a third conductor pattern having a clearance region where the third conductor pattern is removed;
a first insulating layer provided between the first conductor layer and the shield layer;
a second insulating layer provided between the second conductor layer and the shield layer; and
a via conductor provided so as to penetrate the first and second insulating layers to connect the first conductor pattern to the second conductor pattern such that the via conductor passes through the clearance region,
wherein the shield layer has a first main surface contacting the first insulating layer and a second main surface contacting the second insulating layer,
wherein the first main surface of the shield layer is entirely covered with the first insulating layer so as not to be connected to the first conductor layer through a via conductor penetrating the first insulating layer, and
wherein the second main surface of the shield layer is entirely covered with the second insulating layer so as not to be connected to the second conductor layer through a via conductor penetrating the second insulating layer.

16. The multilayer circuit board as claimed in claim 15,
wherein the first insulating layer has a first side surface,
wherein the second insulating layer has a second side surface,
wherein the shield layer further has a third side surface, and
wherein the first, second, and third side surfaces are substantially coplanar with one another and are substantially perpendicular to the first and second main surfaces of the shield layer.

17. The multilayer circuit board as claimed in claim 16, further comprising a side surface conductor formed on the first, second, and third side surfaces.

18. The multilayer circuit board as claimed in claim 17, wherein the shield layer is electrically connected to at least one of the first and second conductor layers via the side surface conductor.

19. The multilayer circuit board as claimed in claim 15, wherein the first insulating layer is made of different material from the second insulating layer.

20. The multilayer circuit board as claimed in claim 19, wherein the first insulating layer has a different dielectric constant from the second insulating layer.

* * * * *